US010224471B2

(12) United States Patent
Lee et al.

(10) Patent No.: US 10,224,471 B2
(45) Date of Patent: *Mar. 5, 2019

(54) LIGHT EMITTING DEVICE PACKAGE HAVING IMPROVED ELECTRICAL RELIABILITY AND LIGHTING APPARATUS INCLUDING THE PACKAGE

(71) Applicant: LG INNOTEK CO., LTD., Seoul (KR)

(72) Inventors: Sang Youl Lee, Seoul (KR); Kwang Ki Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/972,736

(22) Filed: May 7, 2018

(65) Prior Publication Data

US 2018/0254396 A1 Sep. 6, 2018

Related U.S. Application Data

(63) Continuation of application No. 15/645,788, filed on Jul. 10, 2017, now Pat. No. 9,991,433, which is a
(Continued)

(30) Foreign Application Priority Data

Oct. 17, 2014 (KR) .......................... 10-2014-0140871

(51) Int. Cl.
*H01L 33/38* (2010.01)
*H01L 33/62* (2010.01)
(Continued)

(52) U.S. Cl.
CPC .............. *H01L 33/62* (2013.01); *H01L 33/38* (2013.01); *H01L 33/382* (2013.01);
(Continued)

(58) Field of Classification Search
None
See application file for complete search history.

(56) References Cited

U.S. PATENT DOCUMENTS

| 8,487,374 B2 | 7/2013 | Ohta et al. |
| 8,497,146 B2 * | 7/2013 | Odnoblyudov ..... H01L 33/0079 438/33 |

(Continued)

FOREIGN PATENT DOCUMENTS

| CN | 103996775 | 8/2014 |
| CN | 104022202 | 9/2014 |

(Continued)

OTHER PUBLICATIONS

European Search Report dated Jan. 22, 2016 issued in Application No. 15188055.6.
(Continued)

*Primary Examiner* — Bilkis Jahan
(74) *Attorney, Agent, or Firm* — KED & Associates, LLP

(57) ABSTRACT

Embodiments provide a light emitting device package including a substrate, a light emitting structure disposed under the substrate and including a first conductive semiconductor layer, an active layer, and a second conductive semiconductor layer, first and second electrodes connected to the first and second conductive semiconductor layers, a first pad connected to the first electrodes in first-first through-holes penetrating the second conductive semiconductor layer and the active layer, and a first insulation layer disposed between the first pad and the second conductive semiconductor layer and between the first pad and the active layer to cover the first electrodes in a first-second through-hole, and a second pad connected to the second electrode through a second through-hole penetrating the first insulation layer and electrically spaced apart from the first pad.
(Continued)

The second pad does not overlap the first insulation layer in the first-second through-hole in a thickness direction of the light emitting structure.

20 Claims, 9 Drawing Sheets

Related U.S. Application Data continuation of application No. 14/885,427, filed on Oct. 16, 2015, now Pat. No. 9,735,328.

(51) Int. Cl.
*H01L 33/60* (2010.01)
*H01L 33/20* (2010.01)
*H01L 33/48* (2010.01)

(52) U.S. Cl.
CPC ............ *H01L 33/483* (2013.01); *H01L 33/60* (2013.01); *H01L 33/20* (2013.01); *H01L 33/387* (2013.01); *H01L 33/486* (2013.01); *H01L 2224/16* (2013.01)

(56) References Cited

U.S. PATENT DOCUMENTS

| | | | |
|---|---|---|---|
| 8,569,772 B2 | 10/2013 | Kim | |
| 9,035,341 B2 | 5/2015 | Hwang et al. | |
| 9,159,879 B2 | 10/2015 | Matsumura | |
| 9,236,526 B2 | 1/2016 | Choi et al. | |
| 9,368,691 B2 | 6/2016 | Moon et al. | |
| 9,991,433 B2* | 6/2018 | Lee | H01L 33/483 |
| 2004/0029366 A1* | 2/2004 | Jakoby | G01F 23/0092 |
| | | | 438/496 |
| 2011/0012164 A1 | 1/2011 | Kim | |
| 2011/0140160 A1 | 6/2011 | Kim et al. | |
| 2012/0056150 A1 | 3/2012 | Lee et al. | |
| 2012/0187424 A1* | 7/2012 | Kim | H01L 27/156 |
| | | | 257/88 |
| 2012/0326171 A1 | 12/2012 | Lee et al. | |
| 2013/0105827 A1 | 5/2013 | Kim et al. | |
| 2013/0105845 A1 | 5/2013 | Kim et al. | |
| 2013/0234105 A1 | 9/2013 | Chang et al. | |
| 2013/0292718 A1 | 11/2013 | Chu et al. | |
| 2013/0292719 A1* | 11/2013 | Lee | H01L 33/08 |
| | | | 257/93 |
| 2014/0124821 A1* | 5/2014 | Tomonari | H01L 33/38 |
| | | | 257/99 |
| 2014/0231851 A1 | 8/2014 | Tsai et al. | |
| 2014/0231853 A1 | 8/2014 | Uemura | |
| 2014/0312369 A1* | 10/2014 | Yoon | H01L 33/382 |
| | | | 257/96 |
| 2015/0364665 A1 | 12/2015 | Lopez | |

FOREIGN PATENT DOCUMENTS

| | | |
|---|---|---|
| EP | 2 772 949 A2 | 9/2014 |
| EP | 2 782 149 A2 | 9/2014 |
| JP | 2004-056109 A | 2/2004 |
| JP | 2013-024746 | 2/2013 |
| JP | 2014-009468 | 1/2014 |
| JP | 2014-097945 | 5/2014 |
| JP | 5915504 | 4/2016 |
| JP | 5929714 | 5/2016 |
| TW | 201438300 | 10/2014 |
| WO | WO 2014/128574 A1 | 8/2014 |

OTHER PUBLICATIONS

United States Notice of Allowance dated Apr. 12, 2017 issued in U.S. Appl. No. 14/885,427.
United States Notice of Allowance dated Feb. 5, 2018 issued in U.S. Appl. No. 15/645,788.
Chinese Office Action dated Aug. 23, 2018 issued in Application No. 201510680302.2 (with English translation).

* cited by examiner

LIGHT EMITTING DEVICE PACKAGE HAVING IMPROVED ELECTRICAL RELIABILITY AND LIGHTING APPARATUS INCLUDING THE PACKAGE

CROSS REFERENCE TO RELATED APPLICATIONS

This application is a Continuation Application of prior U.S. patent application Ser. No. 15/645,788 filed Jul. 10, 2017, which is a Continuation Application of prior U.S. patent application Ser. No. 14/885,427 filed Oct. 16, 2015 (now U.S. Pat. No. 9,735,328 issued Aug. 15, 2017), which claims priority under 35 U.S.C. § 119 to Korean Application No. 10-2014-0140871, filed in Korea on Oct. 17, 2014, which is hereby incorporated in its entirety by reference as if fully set forth herein.

BACKGROUND

1. Field

Embodiments relate to a light emitting device package and a lighting apparatus including the package.

2. Background

Light Emitting Diodes (LEDs) are semiconductor devices that convert electricity into light using characteristics of compound semiconductors so as to enable transmission/reception of signals, or that are used as a light source. Group III-V nitride semiconductors are highlighted as core materials of light emitting devices such as, for example, LEDs or Laser Diodes (LDs) due to physical and chemical characteristics thereof.

The LEDs are eco-friendly because they do not include environmentally harmful materials such as mercury (Hg) used in conventional lighting devices, e.g., fluorescent lamps and incandescent bulbs. The LEDs also have several advantages, e.g., long lifespan and low power consumption. As such, conventional light sources are being rapidly replaced with LEDs. Studies to improve the reliability of conventional light emitting device packages including light emitting diodes are being conducted from various approaches.

BRIEF DESCRIPTION OF THE DRAWINGS

The embodiments will be described in detail with reference to the following drawings in which like reference numerals refer to like elements wherein.

DETAILED DESCRIPTION

Figure 1:
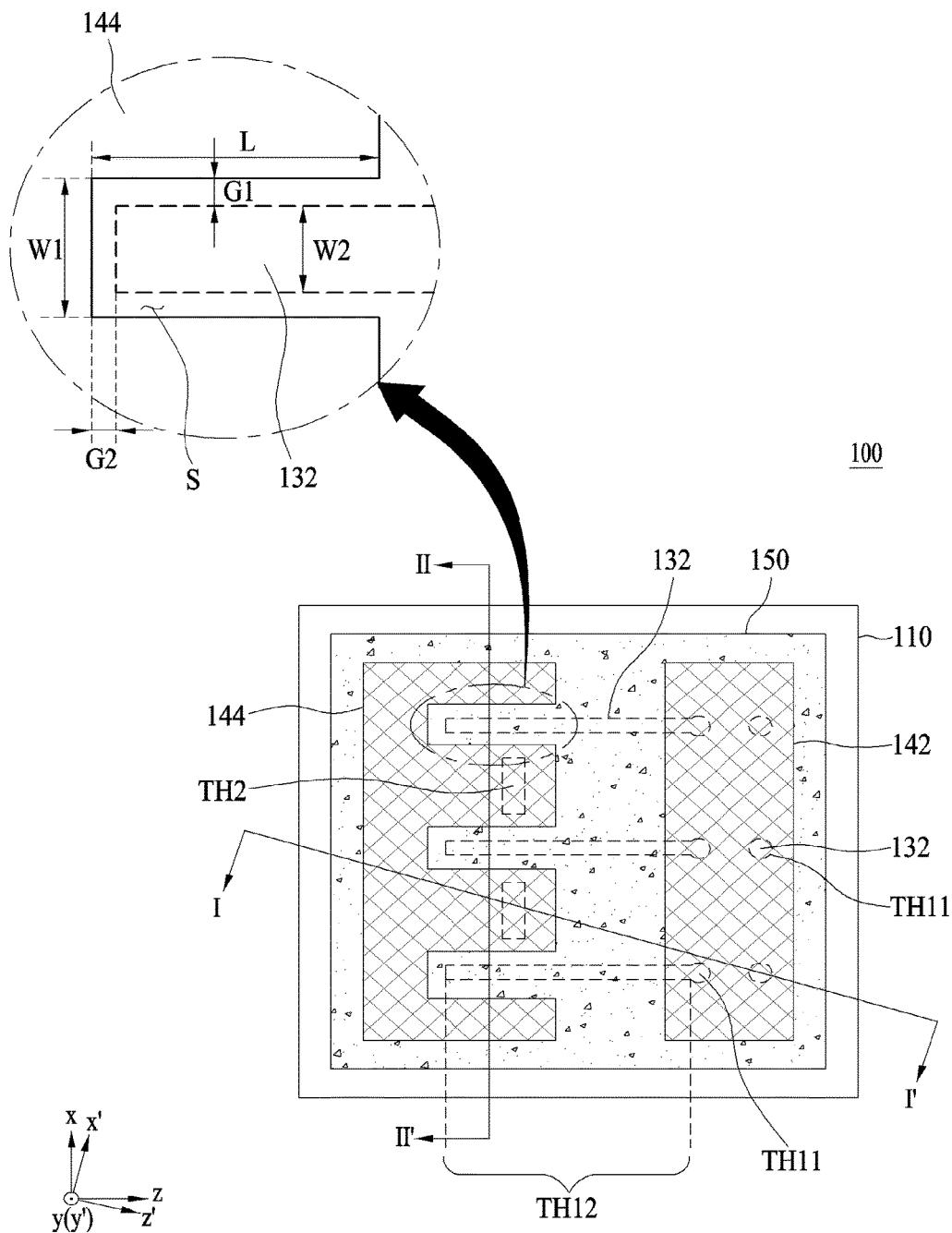
FIG. 1 is a plan view of a light emitting device package according to an embodiment.
Figure 2:
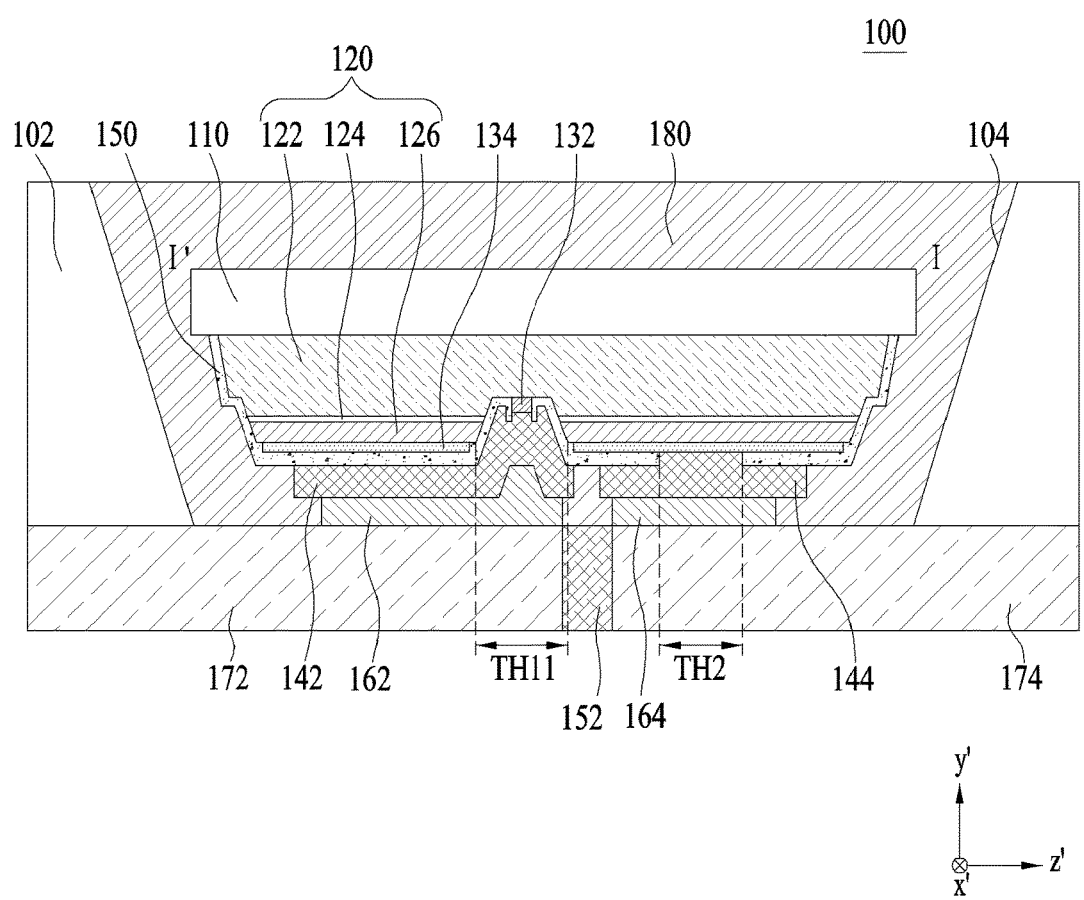
FIG. 2 is a sectional view taken along line I-I' of the light emitting device package illustrated in FIG. 1.
Figure 3:
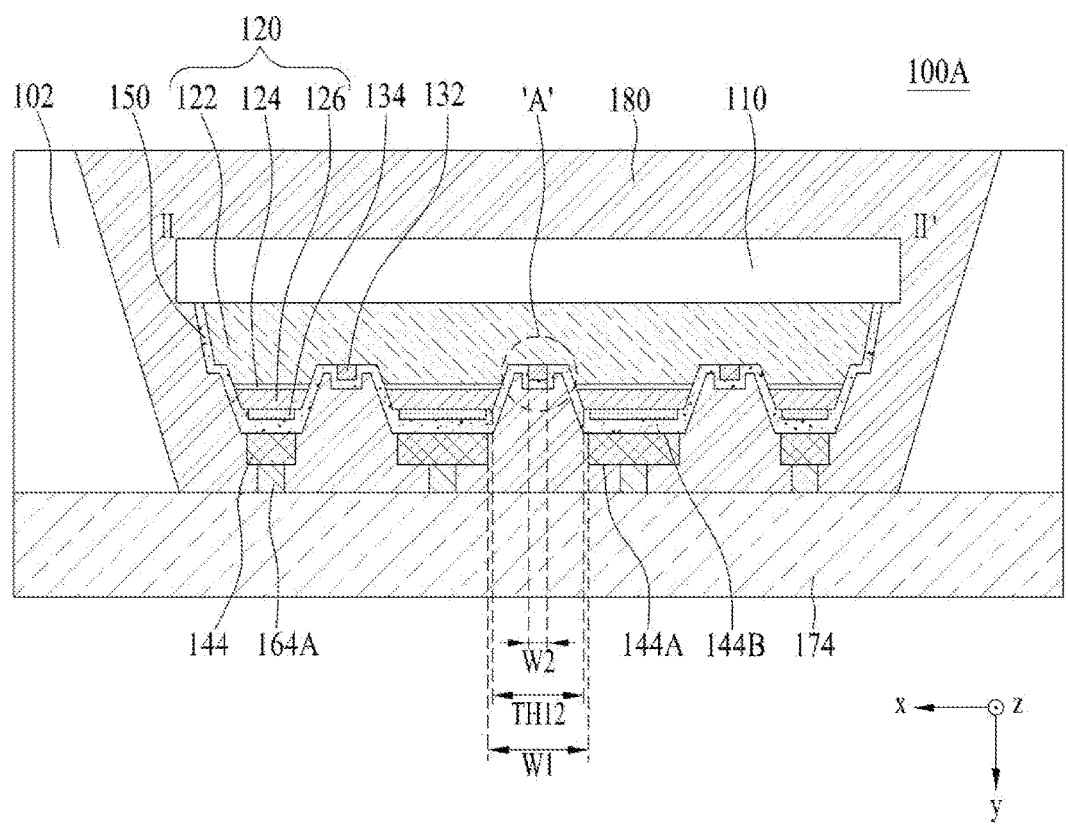
FIG. 3 is a sectional view of one embodiment taken along line II-II' of the light emitting device package illustrated in FIG. 1.

FIG. 1 is a plan view of a light emitting device package 100 according to an embodiment, FIG. 2 is a sectional view taken along line I-I' of the light emitting device package 100 illustrated in FIG. 1, and FIG. 3 is a sectional view of one embodiment 100A taken along line II-II' of the light emitting device package 100 illustrated in FIG. 1.

Referring to FIGS. 1 and 2, the light emitting device package 100 according to the embodiment may include a package body 102, a substrate 110, a light emitting structure 120, first and second electrodes (or contact layers) 132 and 134, first and second pads 142 and 144, first and second insulation layers 150 and 152, first and second solders 162 and 164, first and second lead frames 172 and 174, and a molding member 180.

For convenience of description, the package body 102, the second insulation layer 152, the first and second solders 162 and 164, the first and second lead frames 172 and 174, and the molding member 180, which are illustrated in FIG. 2, are not illustrated in FIG. 1. That is, FIG. 1 illustrates the configuration of a light emitting device.

The package body 102 may define a cavity C. For example, as exemplarily illustrated in FIG. 2, the package body 102 may define the cavity C along with the first and second lead frames 172 and 174. The cavity C may be defined by an inner side surface 104 of the package body 102 and upper surfaces of the first and second lead frames 172 and 174. However, the embodiment is not limited thereto, and in another embodiment, the cavity C may be defined only by the package body 102, unlike the illustration of FIG. 2.

Alternatively, a barrier wall may be disposed on the flat upper surface of the package body 102, and the cavity may be defined by the barrier wall and the upper surface of the package body 102. Although the package body 102 may be formed of, for example, an Epoxy Molding Compound (EMC), the embodiment is not limited to the material of the package body 102.

The light emitting structure 120 is disposed under the substrate 110. The substrate 110 may comprise a conductive material or non-conductive material. For example, the substrate 110 may comprise at least one of sapphire ($Al_2O_3$), GaN, SiC, ZnO, GaP, InP, $Ga_2O_3$, GaAs, or Si, although the embodiment is not limited to the material of the substrate 110.

In order to improve the difference in the Coefficient of Thermal Expansion (CTE) and the lattice mismatch between the substrate 110 and the light emitting structure 120, a buffer layer (or a transition layer) may be further disposed between the substrate 110 and light emitting structure 120. The buffer layer, for example, may comprise at least one material selected from the group consisting of Al, In, N, and Ga, without being limited thereto. In addition, the buffer layer may have a single layer or multi-layer structure.

The light emitting structure 120 may include a first conductive semiconductor layer 122, an active layer 124, and a second conductive semiconductor layer 126. The first conductive semiconductor layer 122, the active layer 124, and the second conductive semiconductor layer 126 may be stacked one above another in this sequence starting from the substrate 110 toward the first and second lead frames 172 and 174 (i.e. in the −y-axis).

The first conductive semiconductor layer 122 is disposed under the substrate 110. The first conductive semiconductor layer 122 may be implemented by, e.g., Group III-V or II-VI compound semiconductors doped with a first conductive dopant. When the first conductive semiconductor layer 122 is an n-type semiconductor layer, the first conductive dopant may be an n-type dopant and may comprise Si, Ge, Sn, Se, or Te, without being limited thereto.

For example, the first conductive semiconductor layer 122 may comprise a semiconductor material having a composition of $Al_xIn_yGa_{(1-x-y)}N$ ($0 \leq x \leq 1$, $0 \leq y \leq 1$, $0 \leq x+y \leq 1$). The first conductive semiconductor layer 122 may comprise any one or more materials selected from among GaN, InN, AlN, InGaN, AlGaN, InAlGaN, AlInN, AlGaAs, InGaAs, AlInGaAs, GaP, AlGaP, InGaP, AlInGaP, and InP.

The active layer 124 may be disposed between the first conductive semiconductor layer 122 and the second conductive semiconductor layer 126. The active layer 124 is a layer in which electrons (or holes) injected through the first conductive semiconductor layer 122 and holes (or electrons) injected through the second conductive semiconductor layer 126 combine with each other to emit light having energy determined by an inherent energy band of a constituent material of the active layer 124. The active layer 124 may be formed into at least one structure selected from among a single-well structure, a multi-well structure, a single-quantum well structure, a multi-quantum well structure, a quantum dot structure, and a quantum wire structure.

The active layer 124 may include a well layer and a barrier layer having a pair structure of any one or more of InGaN/GaN, InGaN/InGaN, GaN/AlGaN, InAlGaN/GaN, GaAs(InGaAs)/AlGaAs, and GaP(InGaP)/AlGaP, without being limited thereto. The well layer may be formed of a material having lower band gap energy than the band gap energy of the barrier layer.

A conductive clad layer may be formed above and/or under the active layer 124. The conductive clad layer may be formed of semiconductors having higher band gap energy than the band gap energy of the barrier layer of the active layer 124. For example, the conductive clad layer may include GaN, AlGaN, InAlGaN, or a super lattice structure. In addition, the conductive clad layer may be doped with an n-type or p-type dopant.

In some embodiments, the active layer 124 may emit ultraviolet light having a specific wavelength band. The ultraviolet light wavelength band may be within a range from 100 nm to 400 nm. In particular, the active layer 124 may emit light having a wavelength band within a range from 100 nm to 280 nm. However, the embodiment is not limited to the wavelength band of light emitted from the active layer 124.

The second conductive semiconductor layer 126 may be disposed under the active layer 124. The second conductive semiconductor layer 126 may be formed of a semiconductor compound, and may be formed of, for example, Group III-V or II-VI compound semiconductors. For example, the second conductive semiconductor layer 126 may comprise a semiconductor material having a composition of $In_xAl_yGa_{1-x-y}N$ ($0 \leq x \leq 1$, $0 \leq y \leq 1$, $0 \leq x+y \leq 1$). The second conductive semiconductor layer 126 may be doped with a second conductive dopant. When the second conductive semiconductor layer 126 is a p-type semiconductor layer, the second conductive dopant may be a p-type dopant and may include, for example, at least one of Mg, Zn, Ca, Sr, or Ba.

The first conductive semiconductor layer 122 may be an n-type semiconductor layer, and the second conductive semiconductor layer 126 may be a p-type semiconductor layer. Alternatively, the first conductive semiconductor layer 122 may be a p-type semiconductor layer, and the second conductive semiconductor layer 126 may be an n-type semiconductor layer.

The light emitting structure 120 may be implemented in any one structure selected from among an n-p junction structure, a p-n junction structure, an n-p-n junction structure, and a p-n-p junction structure.

The first electrodes 132 may be electrically connected to the first conductive semiconductor layer 122 which is exposed by mesa-etching. As the second conductive semiconductor layer 126, the active layer 124, and a portion of the first conductive semiconductor layer 122 are mesa-etched, first through-holes are formed so as to penetrate the second conductive semiconductor layer 126 and the active layer 124. At this time, the first electrodes 132 are formed above the first conductive semiconductor layer 122, which is exposed through those first-first through-holes TH11 of the first through-holes. The first-first through-holes TH11 correspond to those first through-holes, through which the first pad 142 is electrically connected to the first electrodes 132. As exemplarily illustrated in FIG. 1, the first electrodes 132 may have a strip shape when in plan view, so as to be elongated in the z-axis.

To assist understanding, the first electrodes 132, which are covered with the first insulation layer 150 as exemplarily illustrated in FIG. 3, are designated by the dotted line in FIG. 1, and the first-first through-holes TH11, which are covered with the first pad 142 as exemplarily illustrated in FIG. 2, are designated by the dotted line in FIG. 1. In addition, as exemplarily illustrated in FIG. 2, in each first-first through-hole TH11, although the first electrode 132 is disposed under the exposed first conductive semiconductor layer 122 and the width of the first-first through-hole TH11 in the Z'-axis is greater than the width of the first electrode 132 in the Z'-axis, for convenience of description, the first-first through-hole TH11 and the first electrode 132 are illustrated in FIG. 1 as being the same width as each other. However, the plan shapes of the first-first through-hole TH11 and the first electrode 132 will be described below in detail with reference to FIGS. 6A and 6B.

In addition, although FIG. 1 illustrates that the number of the first-first through-holes TH11 is 6, the embodiment is not limited thereto. The number of the first-first through-holes TH11 may be greater or less than 6. The first electrodes 132 may comprise an ohmic contact material, and serve as an ohmic layer. Thus, a separate ohmic layer (not illustrated) may be unnecessary, or a separate ohmic layer may be disposed above or under the first electrodes 132.

The second electrode 134 may be disposed under the second conductive semiconductor layer 126 so as to be electrically connected to the second conductive semiconductor layer 126. The second electrode 134 may include a transparent electrode and a reflective layer.

The reflective layer may be formed of a reflective material such as silver (Ag). The transparent electrode may be disposed between the reflective layer and the second conductive semiconductor layer 126, and the reflective layer may be disposed under the transparent electrode. The transparent electrode may be a Transparent Conductive Oxide (TCO) film. For example, the transparent electrode may comprise at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, or Ni/IrOx/Au/ITO, and is not limited to these materials.

The second electrode 134 may have ohmic characteristics, and may comprise a material for ohmic contact with the second conductive semiconductor layer 126. When the second electrode 134 serves as an ohmic layer, a separate ohmic layer (not illustrated) may be omitted.

As described above, when the second electrode 134 includes the reflective layer, light, emitted from the active layer 124 and directed to the first and second lead frames 172 and 174, is reflected by the reflective layer of the second electrode 134, which may improve light extraction efficiency.

The light emitting device packages 100 and 100A, illustrated in FIGS. 1 to 3, have a flip-chip bonding structure, and therefore, light emitted from the active layer 124 may be directed through the first electrode 132, the first conductive semiconductor layer 122, and the substrate 110. To this end, the first electrodes 132, the first conductive semiconductor layer 122, and the substrate 110 may be formed of a transmissive material. At this time, although the second conductive semiconductor layer 126 and the second electrode 134 may be formed of a transmissive or non-transmissive material or a reflective material, the embodiment may not be limited to a specific material.

Each of the first and second electrodes 132 and 134 may reflect or transmit light emitted from the active layer 124, rather than absorbing the light, and may be formed of any material that is capable of growing in good quality on the first and second conductive semiconductor layers 122 and 126. For example, each of the first and second electrodes 132 and 134 may be formed of a metal, and may be formed of Ag, Ni, Al, Rh, Pd, Ir, Ru, Mg, Zn, Pt, Au, Hf, and selective combinations thereof.

Meanwhile, the first pad 142 may be connected to the first electrodes 132 through the first-first through-holes TH11. At this time, the first insulation layer 150 may be disposed between the first pad 142 and the second conductive semiconductor layer 126 so that the two 142 and 126 are electrically spaced apart from each other. In addition, the first insulation layer 150 may be disposed between the first pad 142 and the active layer 124 so that the two 142 and 124 are electrically spaced apart from each other.

The second pad 144 may be electrically spaced apart from the first pad 142, and may be connected to the second electrode 134 via second through-holes TH2, which penetrate the first insulation layer 150 disposed under the second conductive semiconductor layer 126.

Referring to FIG. 1, when viewed in plan, the second through-holes TH2 may be located between the first electrodes 132 in the direction (i.e. in the x-axis), which is perpendicular to the longitudinal direction of the first electrodes 132 (i.e. in the z-axis) (or in the direction in which the first pad 142 and the second pad 144 are spaced apart from each other). In the case of FIG. 1, although the major axis of the second through-hole TH2 is illustrated as being the x-axis and the minor axis of the second through-hole TH2 is illustrated as being the z-axis, the embodiment is not limited thereto. That is, in another embodiment, the minor axis of the second through-hole TH2 may be the x-axis and the major axis of the second through-hole TH2 may be the z-axis.

As exemplarily illustrated in FIG. 1, the second pad 144 may be formed in a unitary body, rather than being divided into several portions. In another embodiment, unlike the illustration of FIG. 2, the second pad 144 may be connected to the second electrode 134 without penetrating the first insulation layer 150. Each of the first and second pads 142 and 144 may comprises an electrically conductive metal material, and may comprise the same material as or a different material from each of the first and second electrodes 132 and 134.

Referring to FIG. 3, as described above, as the second conductive semiconductor layer 126, the active layer 124, and a portion of the first conductive semiconductor layer 122 are mesa-etched, first through-holes are formed so as to penetrate the second conductive semiconductor layer 126 and the active layer 124. The first insulation layer 150 may be disposed to cover the first electrodes 132 in first-second through-holes TH12 among the first through-holes. The first-second through-holes TH12 correspond to those first through-holes, through which the first electrodes 132 are not electrically connected to the first pad 142.

As exemplarily illustrated in FIG. 3, although the first electrodes 132 are disposed under the exposed first conductive semiconductor layer 122 and the width of the first-second through-holes TH12 in the x-axis is greater than the width of the first electrodes 132 in the x-axis, for convenience of description, the first-second through-holes TH12 and the first electrodes 132 are illustrated in FIG. 1 as being the same width as each other. The plan shapes of the first-second through-holes TH12 and the first electrodes 132 will be described below in detail with reference to FIGS. 6A and 6B.

At this time, in the embodiment, as exemplarily illustrated in FIG. 3, the second pad 144 may be disposed so as not to overlap the first insulation layer 150 located in the first-second through-holes TH12 in the y-axis (i.e. in the thickness direction of the light emitting structure 120). That is, the second pad 144 may be located near the first-second through-holes TH12, rather than being embedded in the first-second through-holes TH12.

When the second pad 144 is embedded in the first-second through-holes TH12 unlike the illustration of FIG. 3, a lower surface 144A of the second pad 144 may have a curved cross-sectional shape, rather than being flat. This is because the first insulation layer 150, located in the first-second through-holes TH12, has a curved cross-sectional shape. However, according to the embodiment, the lower surface 144A of the second pad 144 may have a flat cross-sectional shape because the second pad 144 is not embedded in the first-second through-holes TH12. Here, the lower surface 144A of the second pad 144 means an opposite surface of an upper surface 144B facing the substrate 110.

Referring to FIGS. 1 and 3, the second pad 144 may include one or more slits S formed in the longitudinal direction of the first electrodes 132 (i.e. in the z-axis) at positions near the first-second through-holes TH12. In the case of the light emitting device packages 100 and 100A illustrated in FIGS. 1 and 3, although three slits S are illustrated, the embodiment is not limited to the number of the slits S. That is, the number of the slits S may be greater or less than 3.

When the light emitting device package 100 has a large planar size (i.e. the product of a long x-axis length and z-axis length), for example, when the light emitting device package 100 has a size of 800 μm×800 μm, the first electrodes 132 may take the form of a plurality of strips, in order to ensure smooth carrier spreading. In addition, the number of the strip-shaped first electrodes 132 may be the same as or different from the number of the slits S of the second pad 144.

In addition, referring to FIG. 1, a first width W1 of the at least one slit S may be equal to or greater than a second width W2 of the first electrodes 132 (or the first-second through-holes TH12).

In addition, when viewed in plan, the second pad 144 may be spaced apart from the first electrodes 132 with a gap G therebetween. Here, the gap G may include a first gap G1 and a second gap G2. The first gap G1 is defined in the longitudinal direction of the first electrodes 132 (i.e. in the z-axis), and represents the separation distance in the x-axis between the second pad 144 and the first electrodes 132. The second gap G2 is defined in the width (W2) direction of the first electrodes 132 (i.e. in the x-axis), and represents the separation distance in the z-axis between the second pad 144 and the first electrodes 132.

When each of the first and second gaps G1 and G2 is below 5 μm, the manufacturing process may be difficult, and stress may be applied to the first insulation layer 150 disposed under the first electrodes 132. In addition, when each of the first and second gaps G1 and G2 is above 20 μm, the contact area between the first electrodes 132 and the first conductive semiconductor layer 122 is reduced, which may deteriorate heat radiation and increase resistance. Accordingly, although each of the first and second gaps G1 and G2 may be within a range from 5 μm to 20 μm, the embodiment is not limited thereto.

Figure 4:
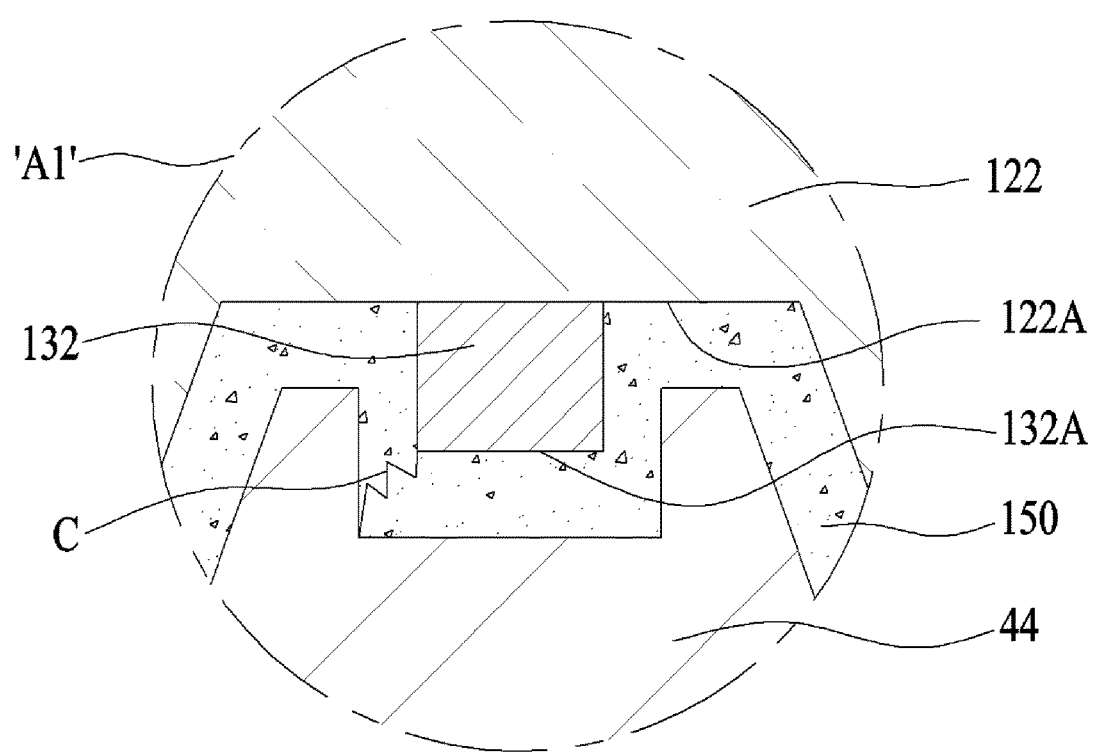
FIG. 4 is an enlarged sectional view of portion CA' illustrated in FIG. 3 according to a comparative embodiment.

FIG. 4 is an enlarged sectional view of portion 'A' illustrated in FIG. 3 according to a comparative embodiment A1. Unlike the embodiment illustrated in FIG. 3, in the case of the comparative embodiment illustrated in FIG. 4, the first insulation layer 150 covering the first electrodes 132 and the second pad 144 overlap each other in the y-axis within the first-second through-holes TH12. Here, the second pad 44 of the comparative embodiment performs the same role as the second pad 144 of the embodiment, excluding the difference in position compared to the second pad 144. In this case, when a crack C is generated in the first insulation layer 150, the second pad 44 and the first electrodes 132 may be electrically connected to each other through the crack C, which may cause a short-circuit.

However, according to the embodiment, as exemplarily illustrated in FIG. 3, the first insulation layer 150 and the second pad 144 do not overlap each other in the y-axis within the first-second through-holes TH12. Thus, even if the crack C is present in the first insulation layer 150 as exemplarily illustrated in FIG. 4, the risk of the second pad 144 and the first electrodes 132 being electrically connected to each other may be completely eliminated.

Generally, a lower surface 122A of the first conductive semiconductor layer 122, which are exposed by mesa-etching, and a lower surface 132A of the first electrode 132 are stepped. Thus, a crack C may be generated in the first insulation layer 150 due to the stepped shape described above during the process of forming the first insulation layer 150 in the first-second through-holes TH12. For this reason, in the embodiment, the second pad 144 is not formed in the first-second through-holes TH12 as described above, which may eliminate the risk of the second pad 144 and the first electrodes 132 being electrically connected to each other, resulting in improved reliability.

Figure 5:
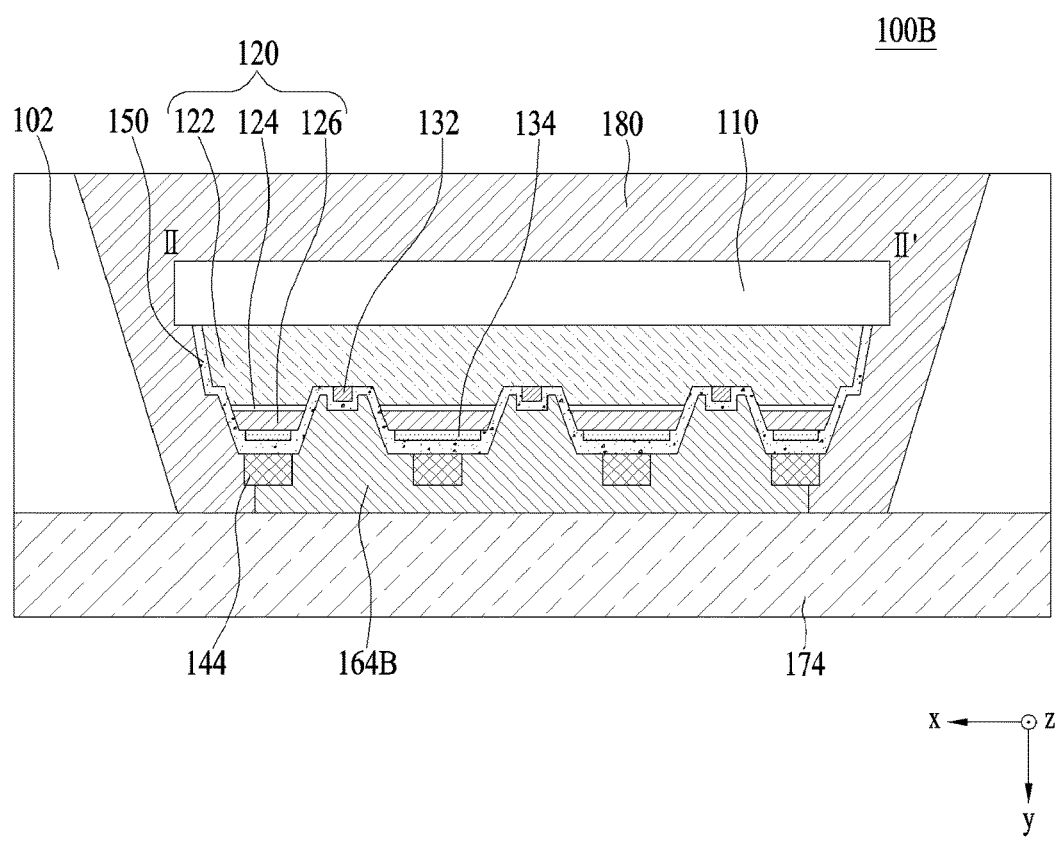
FIG. 5 is a sectional view of another embodiment taken along line II-II' of the light emitting device package illustrated in FIG. 1.

FIG. 5 is a sectional view of another embodiment 100B taken along line II-II' of the light emitting device package 100 illustrated in FIG. 1. Meanwhile, the first and second solders 162 and 164 of the light emitting device package 100 illustrated in FIG. 2 may be electrically connected to the first and second pads 142 and 144 respectively.

In one embodiment, as exemplarily illustrated in FIG. 3, a second solder 164A may be located below the second pad 144, rather than being embedded in the first-second through-hole TH12. In another embodiment, the second solder 164 may be embedded in at least a portion of the first-second through-hole TH12. For example, as exemplarily illustrated in FIG. 5, a second solder 164B may be embedded in the entire first-second through-hole TH12 and may also be located between the light emitting structure 120 and the second lead frame 174 and between the second pad 144 and the second lead frame 174.

At this time, in the case of FIG. 5, the second solder 164B is illustrated as being electrically spaced apart from the first electrodes 132 by the first insulation layer 150. At this time, as exemplarily illustrated in FIG. 4, even if a crack C is present in the first insulation layer 150 within the first-second through-hole TH12, no short-circuit may occur between the second solder 164B and the first electrodes 132. This is because the second solder 164B does not cause stress unlike the second pad 144.

As described above, except for the arrangement shapes of the second solders 164A and 164B, the light emitting device package 100B illustrated in FIG. 5 is the same as the light emitting device package 100A illustrated in FIG. 3, and thus is designated by the same reference numerals and a repeated description thereof is omitted.

In the light emitting device packages 100, 100A and 1006, the first solder 162 may be electrically connected to the first lead frame 172 and the second solder 164; 164A; or 164B may be electrically connected to the second lead frame 174. That is, the first solder 162 may be located between the first lead frame 172 and the first pad 142 so as to electrically connect the two 172 and 142 to each other, and the second solder 164; 164A; or 164B may be located between the second lead frame 174 and the second pad 144 so as to electrically connect the two 174 and 144 to each other. The first solder 162 and the second solder 164; 164A; or 164B may respectively be solder paste or solder balls.

Referring to FIG. 2, the first and second lead frames 172 and 174 may be spaced apart from each other in the direction (e.g., in the Z'-axis), which is perpendicular to the thickness direction of the light emitting structure 120 (i.e. in the y'-axis). Each of the first and second lead frames 172 and 174 may be formed of a conductive material, for example, a metal, and the embodiment is not limited to the kinds of materials of the respective first and second lead frames 172 and 174. In order to electrically isolate the first and second lead frames 172 and 174 from each other, the second insulation layer 152 may be disposed between the first and second lead frames 172 and 174.

In addition, when the package body 102 is formed of a conductive material, for example, a metal, the first and second lead frames 172 and 174 may constitute a portion of the package body 102. Even in this case, the first and second lead frames 172 and 174 of the package body 102 may be electrically isolated from each other by the second insulation layer 152.

Although each of the first and second insulation layers 150 and 152 may comprise at least one of $SiO_2$, $TiO_2$, $ZrO_2$, $Si_3N_4$, $Al_2O_3$, or $MgF_2$, the embodiment is not limited to the material of the first and second insulation layers 150 and 152.

The first and second solders 162 and 164 described above may eliminate the necessity of wires by electrically connecting the first and second conductive semiconductor layers 122 and 126 to the first and second lead frames 172 and 174 respectively via the first and second pads 142 and 144. However, according to another embodiment, the first and second conductive semiconductor layers 122 and 126 may be connected respectively to the first and second lead frames 172 and 174 using wires.

In addition, the first solder 162 and the second solder 164; 164A; or 164B may be omitted. In this case, the first pad 142 may serve as the first solder 162, and the second pad 144 may serve as the second solder 164; 164A; or 164B. When the first solder 162 and the second solder 164; 164A; or 164B are omitted, the first pad 142 may be directly connected to the first lead frame 172 and the second pad 144 may be directly connected to the second lead frame 174.

Meanwhile, the molding member 180 may enclose and protect the light emitting device 110, 120, 132, 134, 142, 144, and 150, the first solder 162, and the second solder 164; 164A; or 164B. The molding member 180 may be formed of, for example, silicon (Si) and contain phosphors, thus being capable of changing (or, converting) the wavelength of light emitted from the light emitting device. Although the phosphors may include phosphors selected from among YAG-based, TAG-based, silicate-based, sulfide-based, or nitride-based wavelength change materials which may change light generated from the light emitting device 100 into white light, the embodiment is not limited to the kinds of phosphors.

The YGA-based and TAG-based phosphors may be selected from among (Y, Tb, Lu, Sc, La, Gd, Sm)3(Al, Ga, In, Si, Fe)5(O, S)12:Ce, and the silicate-based phosphors may be selected from among (Sr, Ba, Ca, Mg)2SiO4:(Eu, F, Cl).

In addition, the sulfide-based phosphors may be selected from among (Ca, Sr)S:Eu, (Sr, Ca, Ba)(Al, Ga)2S4:Eu, and the nitride-based phosphors may be selected from among (Sr, Ca, Si, Al, O)N:Eu (e.g., CaAlSiN4:Eu β-SiAlON:Eu) or Ca-α SiAlON:Eu-based (Cax, My)(Si, Al)12(O, N)16 (here, M is at least one of Eu, Tb, Yb or Er, $0.05<(x+y)<0.3$, $0.02<x<0.27$, and $0.03<y<0.3$, which is phosphors).

Red phosphors may be nitride-based phosphors including N(e.g., CaAlSiN3:Eu). The nitride-based red phosphors have higher reliability in resistance to external environments such as, for example, heat and moisture and lower discoloration risk than sulfide-based phosphors.

Hereinafter, a method for manufacturing the light emitting device package 100 illustrated in FIG. 1 will be described with reference to FIGS. 6A to 6D. However, of course, the embodiment is not limited thereto, and the light emitting device package 100 illustrated in FIG. 1 may be manufactured using any of various other methods.

FIGS. 6A to 6D are process plan views illustrating a method for manufacturing the light emitting device package 100 illustrated in FIG. 1.

Figure 6A:
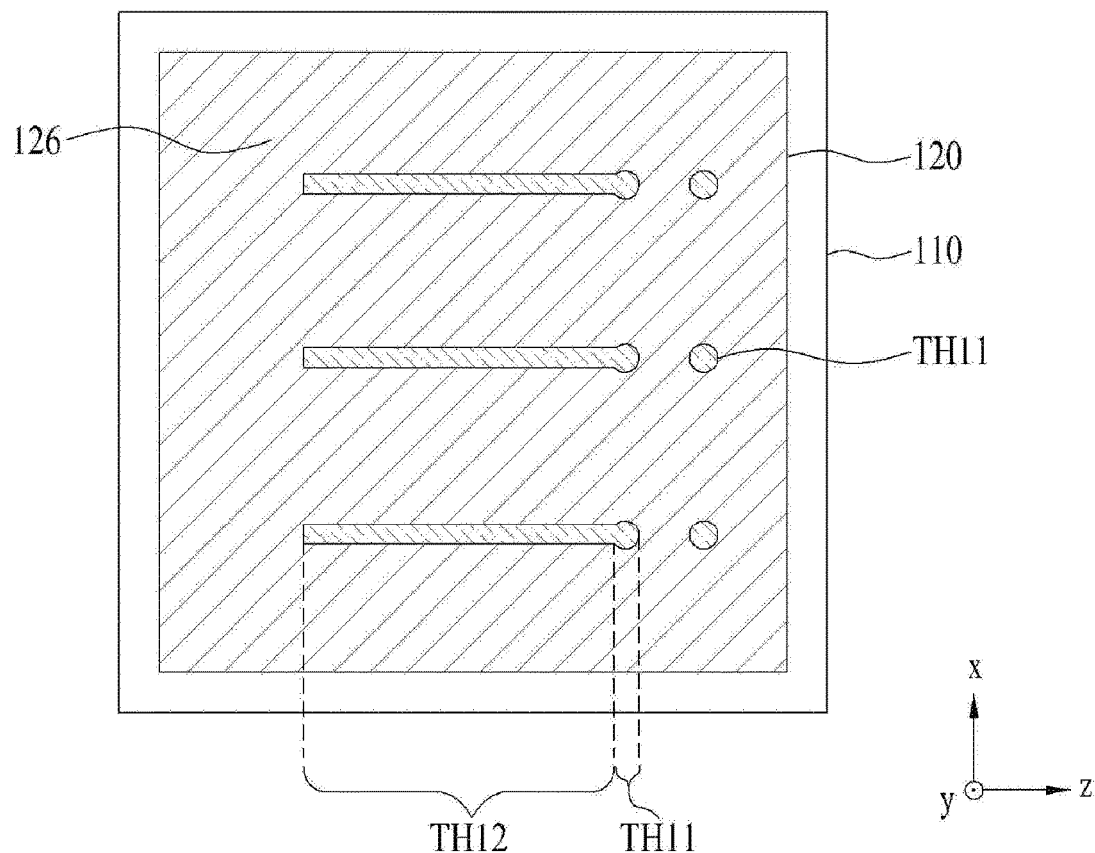
FIGS. 6A to 6D are process plan views illustrating a method for manufacturing the light emitting device package illustrated in FIG. 1.

Referring to FIG. 6A, the light emitting structure 120 is formed on the substrate 110. Here, the first conductive semiconductor layer 122, the active layer 124, and the second conductive semiconductor layer 126 may be formed in sequence on the substrate 110 as exemplarily illustrated in FIGS. 2, 3, and 5. When the light emitting structure 120 is formed as described above, as exemplarily illustrated in FIG. 6A, only the uppermost second conductive semiconductor layer 126 is visible in the plan view of the light emitting device package 100.

Subsequently, the first-first through-holes TH11 and the first-second through-holes TH12, through which the first conductive semiconductor layer 122 is exposed, are formed by removing the second conductive semiconductor layer 126, the active layer 124, and a portion of the first conductive semiconductor layer 122 via mesa etching.

Figure 6B:
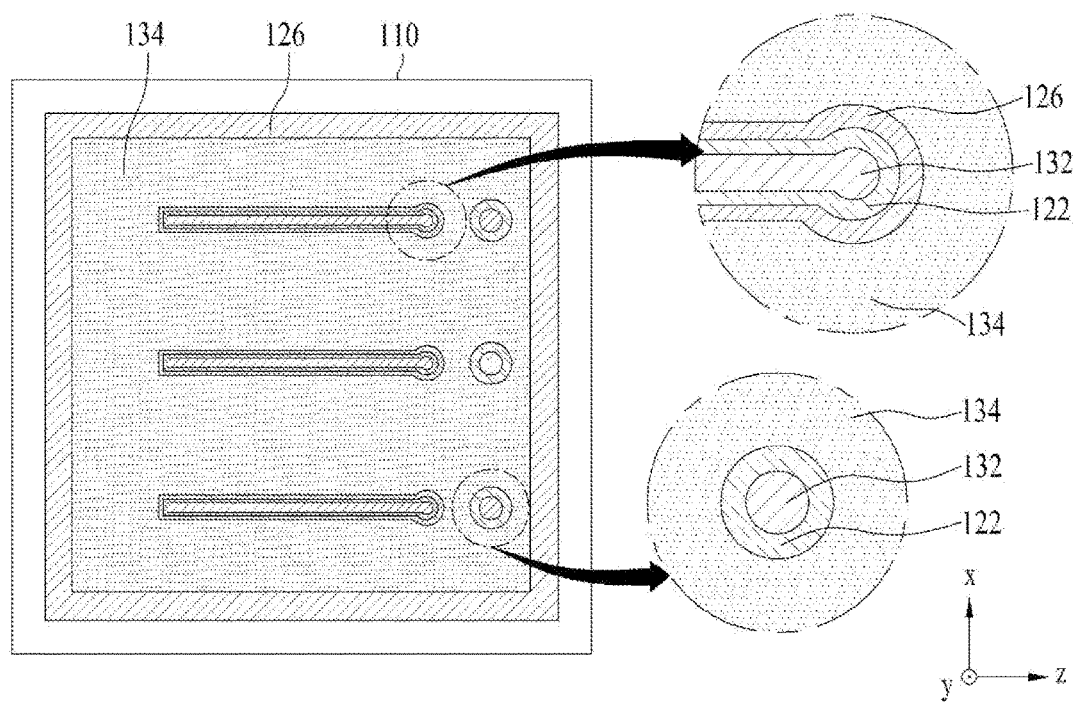

Subsequently, referring to FIG. 6B, the second electrode 134 is formed on the second conductive semiconductor layer 126, and the first electrodes 132 are formed on the first conductive semiconductor layer 122 exposed through the first-first through-holes TH11 and the first-second through-holes TH12.

Figure 6C:
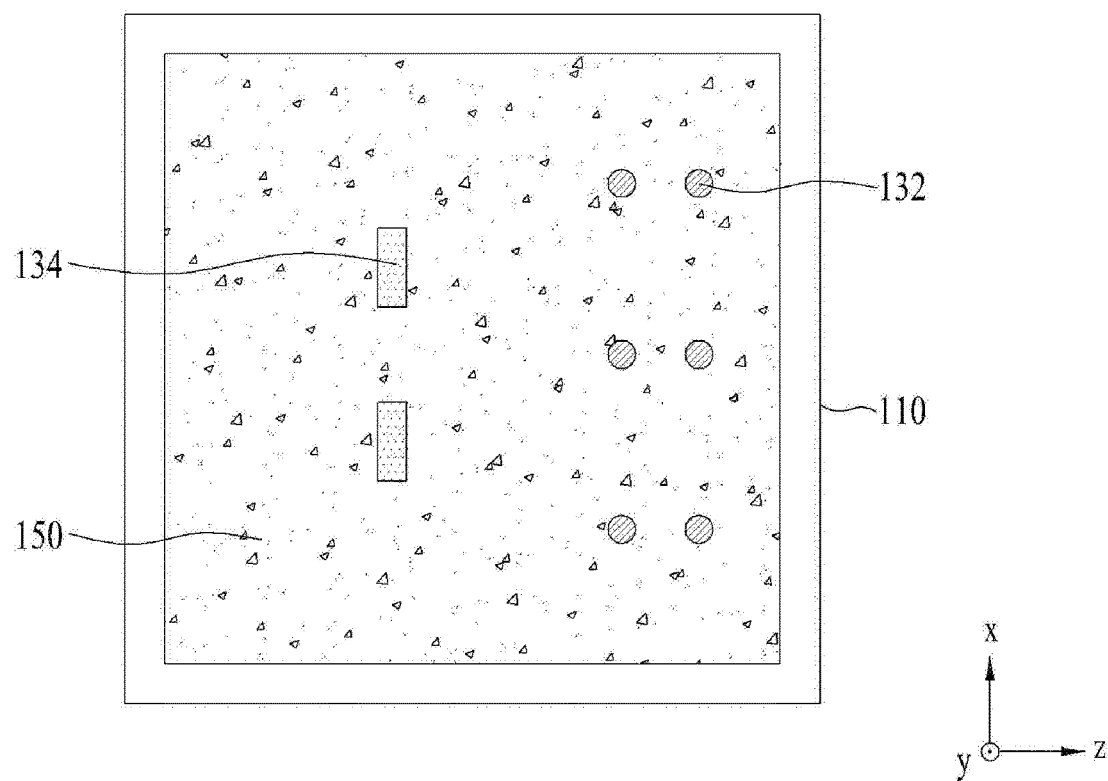

Subsequently, referring to FIG. 6C, the first insulation layer 150 is formed on the entire light emitting device package 100 excluding both the first electrodes 132 located in the first-first through-holes TH11 and the second electrode 134 exposed through the second through-holes TH2.

Figure 6D:
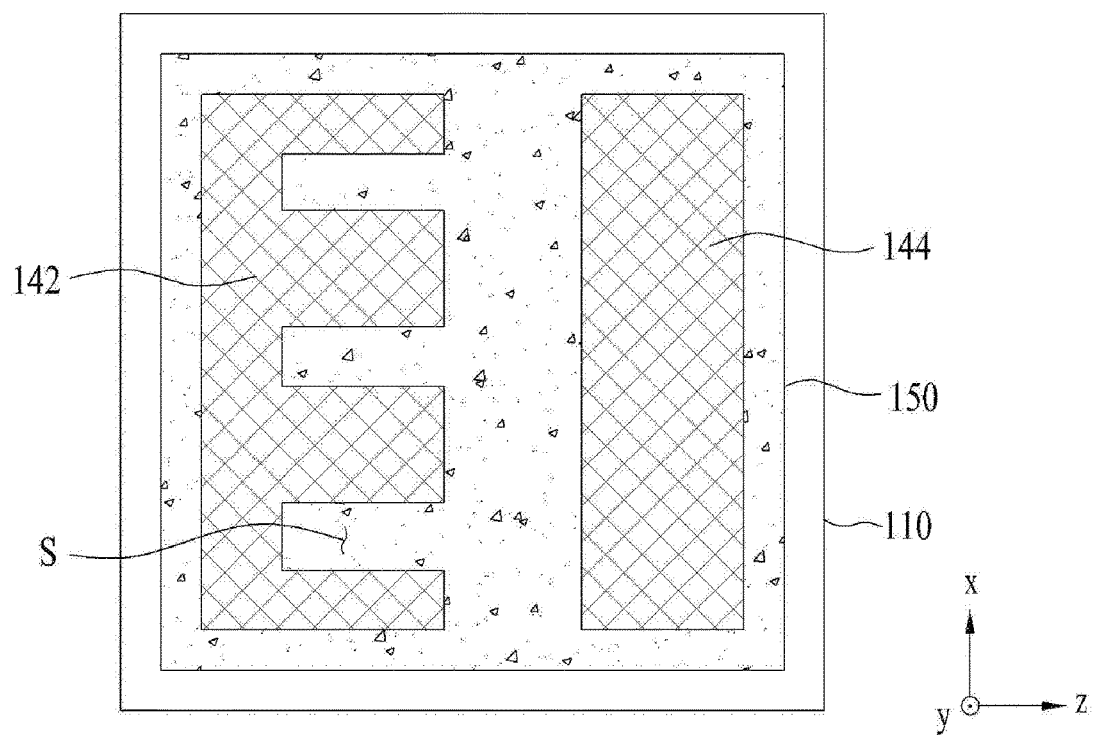

Subsequently, referring to FIG. 6D, the first pad 142 and the second pad 144 are formed on the first insulation layer 150. At this time, the first pad 142 may be located to overlap the first electrodes 132 in the y-axis (i.e. in the thickness direction of the light emitting structure 120) formed on the first conductive semiconductor layer 122 exposed through the first-first through-holes TH11. In addition, the second pad 144 may be located to overlap the second electrode 134 exposed through the second through-holes TH2 in the y-axis.

The light emitting device package 100 illustrated in FIG. 1 is not limited to the cross-sectional shape illustrated in FIG. 2 and may have any of various other cross-sectional shapes. That is, so long as the second pad 144 does not overlap the first-second through-hole TH12 in the thickness direction of the light emitting structure 120 as illustrated in FIG. 1, the light emitting device package 100 illustrated in FIG. 1 may have any of various other cross-sectional shapes.

In addition, in the case of FIG. 1, although each of the first and second pads 142 and 144 is illustrated as having a rectangular shape in plan view, the embodiment is not limited thereto. For example, in another embodiment, each of the first and second pads 142 and 144 may have any of various polygonal planar shapes such as an elliptical, triangular, or pentagonal planar shape.

In the light emitting device package according to the embodiment, an array of a plurality of light emitting device packages may be disposed on a board, and optical members such as, for example, a light guide plate, a prism sheet, and a diffuser sheet may be disposed in an optical path of the light emitting device packages. The light emitting device packages, the board, and the optical members may function as a backlight unit.

In addition, the light emitting device package according to the embodiment may be applied to a display apparatus, an indicator apparatus, and a lighting apparatus.

Here, the display apparatus may include a bottom cover, a reflective plate disposed on the bottom cover, a light emitting module configured to emit light, a light guide plate disposed in front of the reflective plate to forwardly guide light emitted from the light emitting module, optical sheets including prism sheets disposed in front of the light guide plate, a display panel disposed in front of the optical sheets, an image signal output circuit connected to the display panel to supply an image signal to the display panel, and a color filter disposed in front of the display panel. Here, the bottom cover, the reflective plate, the light emitting module, the light guide plate, and the optical sheets may constitute a backlight unit.

In addition, the lighting apparatus may include a light source module which includes a board and the light emitting device package according to the embodiment, a radiator configured to radiate heat of the light source module, and a power supply unit configured to process or convert an electrical signal from an external source so as to supply the same to the light source module. For example, the lighting apparatus may include a lamp, a headlamp, or a streetlight.

The headlamp may include a light emitting module which includes the light emitting device packages arranged on a board, a reflector configured to reflect light, emitted from the light source module, in a given direction, for example, forwardly, a lens configured to forwardly refract light reflected by the reflector, and a shade configured to achieve a light distribution pattern selected by a designer by blocking or reflecting some of light, reflected by the reflector and directed to the lens.

As is apparent from the above description, in a light emitting device package according to the embodiment, a first insulation layer and a second pad do not overlap each other in the thickness direction of a light emitting structure within a first-second through-hole formed by passing-through a second conductive semiconductor layer and an active layer. Therefore, even if a crack is present in the first insulation layer, the risk of the second pad being electrically connected to a first electrode may be completely eliminated, which results in improved reliability.

Embodiments provide a light emitting device package having improved reliability and a lighting apparatus including the package.

In one embodiment, a light emitting device may include a substrate, a light emitting structure disposed under the substrate, the light emitting structure including a first conductive semiconductor layer, an active layer, and a second conductive semiconductor layer, first and second electrodes connected respectively to the first and second conductive semiconductor layers, a first pad connected to a plurality of the first electrodes in a plurality of first-first through-holes, the first-first through-holes being a portion of a first through-hole penetrating the second conductive semiconductor layer and the active layer so as to expose the first conductive semiconductor layer, a first insulation layer disposed between the first pad and the second conductive semiconductor layer and between the first pad and the active layer, so as to cover the first electrodes in a first-second through-hole, the first-second through-hole being remaining portion of the first through-hole, and a second pad connected to the second electrode through a second through-hole penetrating the first insulation layer disposed under the second conductive semiconductor layer, the second pad being electrically spaced apart from the first pad, wherein the second pad is located so as not to overlap the first insulation layer located in the first-second through-holes in a thickness direction of the light emitting structure. The second pad may be located near the first-second through-holes, rather than being embedded in the first-second through-holes. Each of the first and second pads may have an elliptical or polygonal shape in plan view.

For example, the first electrodes may have a strip shape in plan view. The second pad may include at least one slit formed in a longitudinal direction of the first electrodes at positions near the first-second through-holes. The at least one slit may have a width equal to or greater than a width of the first electrodes. The number of the strip-shaped first electrodes may be the same as the number of the at least one slit.

For example, the light emitting device package may further include first and second solders connected respectively to the first and second pads, and first and second lead frames connected respectively to the first and second solders. The second solder may be embedded in at least a portion of the first-second through-holes. The second solder may be located under the second pad, rather than being embedded in the first-second through-holes. The second solder may be electrically spaced apart from the first electrodes by the first insulation layer.

For example, the second through-hole may be located between the respective first electrodes in a direction perpendicular to a longitudinal direction of the first electrodes when viewed in plan.

For example, the first conductive semiconductor layer may be an n-type semiconductor layer, and the second conductive semiconductor layer may be a p-type semiconductor layer.

For example, the second pad may be spaced apart from the first electrodes by a gap in a plane, and the gap may include a first gap formed in a longitudinal direction of the first electrodes and a second gap formed in a width direction of the first electrodes. For example, each of the first and second gaps may be within a range from 5 μm to 20 μm. The second pad may have a flat lower surface. For example, the second pad may include an upper surface facing the substrate, and a lower surface opposite to the upper surface, the lower surface having a flat cross-sectional shape.

For example, the second electrode may include a reflective layer. The first conductive semiconductor layer and the first electrodes may have stepped lower surfaces.

It will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

In addition, the relative terms "first", "second", "top/upper/above", "bottom/lower/under" and the like in the description and in the claims may be used to distinguish between any one substance or element and other substances or elements and not necessarily for describing any physical or logical relationship between the substances or elements or a particular order.

Although the light emitting device package 100 according to the embodiment will be described using the Cartesian coordinate system, of course, it may alternatively be described using other coordinate systems. In the Cartesian coordinate system, the x-axis, the y-axis, and the z-axis illustrated in each drawing are perpendicular to one another, and the x'-axis, the y'-axis, and the z'-axis are perpendicular to one another.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device package, comprising:
a substrate;

a light emitting structure disposed under the substrate, the light emitting structure including a first conductive semiconductor layer, an active layer, and a second conductive semiconductor layer;

a plurality of first through-holes penetrating the second conductive semiconductor layer and the active layer to expose the first conductive semiconductor layer;

a first electrode disposed in the plurality of first through-holes to be connected to the first conductive semiconductor layer;

a second electrode connected to the second conductive semiconductor layer;

a first pad connected to the first electrode in a plurality of first portions of the first through-holes;

an insulation layer disposed between the first pad and the second conductive semiconductor layer; and a second pad connected to the second electrode through a second through-hole penetrating the insulation layer, the second pad being configured to be electrically spaced apart from the first pad, wherein the second pad has a planar comb shape comprising a plurality of slits formed at one side of the second pad, wherein the first electrode comprises;
  a first portion contacting the first conductive semiconductor layer and vertically overlapping the first pad; and
  a second portion connected to the first portion, while not vertically overlapping the first pad and the second pad, and arranged at one of the plurality of slits, wherein the second pad is spaced apart from the second portion of the first electrode by a gap in a plane, the gap including;
  a first distance formed in a first direction corresponding to a width direction of the one of the plurality of slits; and
  a second distance formed in a second direction perpendicular to the first direction, wherein the insulation layer covers the first electrodes in a second portion of the first through-holes, and wherein the second pad does not overlap the insulation layer located in the second portions of the first through-holes in a thickness direction of the light emitting structure.

2. The package according to claim 1, wherein the first pad includes a first cavity.

3. The package according to claim 2, further comprising:
a first solder connected to the first pad; and
a second solder connected to the second pad.

4. The package according to claim 3, wherein the first solder is embedded in the first cavity of the first pad.

5. The package according to claim 1, wherein the first conductive semiconductor layer is an n-type semiconductor layer, and
wherein the second conductive semiconductor layer is a p-type semiconductor layer.

6. The package according to claim 1, wherein the first portion of the first electrode is surrounded by the second electrode.

7. The package according to claim 1, wherein the second portion of the first electrode includes a plurality of second portions, and
wherein the second through-hole is located between the second portions of the first electrode.

8. The package according to claim 1, wherein each of the slits has a width equal to or greater than a width of the second portion of the first electrode.

9. The package according to claim 1, wherein the second pad has a flat lower surface.

10. The package according to claim 1, wherein the second electrode includes a reflective layer.

11. The package according to claim 1, wherein the second pad is located near the second portion of the first electrode.

12. The package according to claim 1, further comprising:
a body comprising a second cavity; and
a molding member disposed between the body and the substrate.

13. The package according to claim 1, further comprising a phosphor disposed on the substrate.

14. The package according to claim 1, wherein the number of the first through-holes is greater than the number of the second through-holes.

15. The package according to claim 1, wherein a width of each of the slits is greater than a width of the second portion of the first electrode.

16. The package according to claim 1, wherein the number of the first through-holes is greater than the number of the second through-holes.

17. The package according to claim 1, wherein the first conductive semiconductor layer has stepped lower surfaces.

18. The package according to claim 1, further comprising:
a first lead frame connected to the first solder; and
a second lead frame connected to the second solder.

19. The package according to claim 1, wherein the first electrode has a strip shape in plan view.

20. A lighting apparatus including the light emitting device package according to claim 1.

* * * * *